United States Patent [19]

Bailey et al.

[11] Patent Number: 4,712,060
[45] Date of Patent: Dec. 8, 1987

[54] SAMPLING AVERAGE PHASE METER

[75] Inventors: Rick S. Bailey; Arthur C. Holly, both of Austin, Tex.

[73] Assignee: Board of Regents The University of Texas System, Austin, Tex.

[21] Appl. No.: 902,187

[22] Filed: Aug. 29, 1986

[51] Int. Cl.$^4$ .................................................. G01R 25/00
[52] U.S. Cl. .................................... 324/83 R; 328/133
[58] Field of Search ................ 324/83 R, 83 A, 83 D; 328/133; 340/658

[56] References Cited

U.S. PATENT DOCUMENTS

| | | | |
|---|---|---|---|
| 3,286,176 | 11/1966 | Birnbolm | 324/83 |
| 3,559,161 | 1/1971 | Raudsep | 340/6 |
| 3,663,956 | 5/1972 | Purdy et al. | 324/83 D |
| 3,878,526 | 4/1975 | Pedersen | 343/7.7 |
| 3,887,775 | 6/1975 | Montefusco | 324/83 D |
| 3,906,361 | 9/1975 | Nessler et al. | 324/83 D |
| 4,038,540 | 7/1977 | Roberts | 235/181 |
| 4,071,821 | 1/1978 | Harthill et al. | 324/83 R |
| 4,361,808 | 11/1982 | Kern et al. | 324/83 D |
| 4,445,389 | 5/1984 | Potzick et al. | 73/861.27 |
| 4,520,320 | 5/1985 | Potzick et al. | 328/133 |
| 4,547,733 | 10/1985 | Thoraval | 324/83 D |
| 4,642,562 | 2/1987 | Collins | 324/83 D |

OTHER PUBLICATIONS

"C—Moss Phasemeter Can Be Built in Lab", M. G. Fishel, Electronics, p. 98, May 1, 1975.
"Edge—Triggered Flip—Flops Make 360° Phase Meter", James C. Hager, Jr., Electronics, pp. 100–101, Aug. 21, 1975.
Specification for National Semiconductor Integrated Circuit Model No. LM1391.
Specification for Hewlett—Packard Gain/Phase Meter, Model No. 3575A.
Specification for Ocean Data Equipment Militarized Computing Pulse Voltage/Phase Meter, Model No. VIP—100M.
"Phase Comparator", Linear Applications Handbook, pp. AN72.25-26, 1980, National Semiconductor Corporation.

Primary Examiner—Michael J. Tokar
Attorney, Agent, or Firm—Arnold, White & Durkee

[57] ABSTRACT

Apparatus for generating a signal indicative of the phase of a selected pulsed single frequency signal in a background of noise. A first averaging phase detector generates the average phase of the selected signal. A second averaging phase detector generates the average phase of a quadrature signal. Pulse phase averagers compensate for noise in the average phases. A quadrature logic section selects the first average phase when it varies linearly, and selects a phase proportional to the guadrature phase when the first phase varies non-linearly.

2 Claims, 5 Drawing Figures

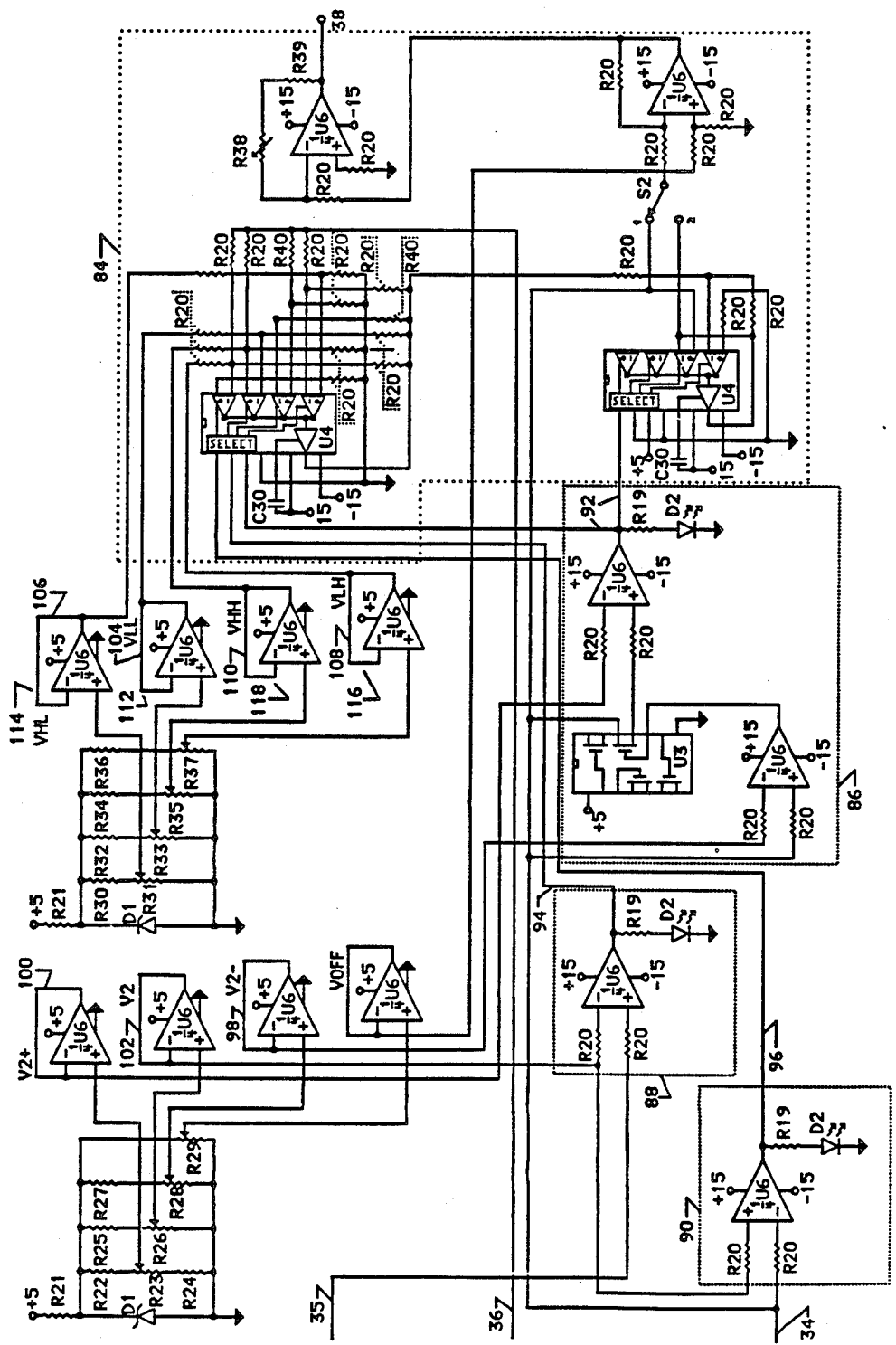
Fig. 5, continued

SAMPLING AVERAGE PHASE METER

BACKGROUND OF THE INVENTION

1. Field of the Invention

The present invention relates to real-time phase measurement of an electrical signal. The invention has particular application to phase measurements when measuring acoustic pressure field variations with a sonar transducer.

2. Description of the Related Art

Two methods are commonly used to measure an acoustic pressure with a sonar transducer. The first is to record in an analog fashion the output of the transducer for subsequent digitization and processing on a digital computer. The other method is to use real-time instrumentation for retrieval of the amplitude and phase. The latter method is preferred because errors while conducting an experiment can more easily be detected and corrected. Continuous wave phase meters, such as the Hewlett-Packard Model HP-3575A, have been used to measure the transducer signal phase relative to a reference signal. These devices are designed for electronic bench testing of analog circuits where noisy signals are of no concern. Also, these devices have response times which prevent them from following rapidly varying phases. When short pulses of continuous-wave signals (SONAR) are used, the measurement of phase is complicated in that the pertinent phase information is contained in a shorter period of time. Sampling continuous-wave phase meters are available, such as Model No. VIP-100M, manufactured by Ocean Data Equipment Corporation, which can be used on signals for which the pertinent phase information is contained in a short period of time. However, such phase meters do not provide accurate measurements in the presence of noise. U.S. Pat. No. 3,878,526 to Pedersen discloses phase measurement in a signal processor employing quadrature reference signals to detect target movement. U.S. Pat. No. 3,646,34 to Wold discloses a hybrid analog/digital system which correlates two input signals. U.S. Pat. No. 4,071,821 to Harthill et al. discloses a digital apparatus for determining the phase of a signal by quadrature correlation. The Harthill patent does not appear to disclose any noise compensation such as pulse-to-pulse averaging of the phase count.

A digital FFT analyzer, such as Model No. 556, manufactured by NICOLET, has the capability of obtaining the phase of short-duration signals against a noisy background. However, the FFT analyzer, since it also performs more complex operations on a signal, is a large and complex piece of equipment.

Thus, there is a need in the art for a simple device which can be used when phase measurements alone are required of a pulsed single-frequency signal in a background of noise.

SUMMARY OF THE INVENTION

The above-noted and other drawbacks of the prior art are overcome by providing a method and apparatus for measuring the phase of a pulsed single-frequency sinusoidal input signal against a background of noise which features the capability of generating accurate phase measurements of phases from plus 180° to minus 180° and which can achieve an accuracy of plus or minus 0.01°. The undesirable feature common to prior art devices wherein the resolution of the phase measurement is reduced due to digitization of the signals measured, is eliminated by the invention, and it is believed to be the first real-time hybrid digital/analog phase measurement device which can achieve accurate phase measurement against a noisy background.

The above-noted and other aspects of the present invention will become more apparent from a detailed description of the preferred embodiment when read in conjunction with the drawings.

BRIEF DESCRIPTION OF THE DRAWINGS

The invention will further be described by reference to the accompanying drawings which illustrate a particular embodiment of a hybrid digital/analog phase measurement device for measuring the phase of a pulsed single frequency sinusoidal input signal in accordance with the present invention, wherein like members bear like reference numerals and wherein.

DESCRIPTION OF A PREFERRED EMBODIMENT

Figure 1:
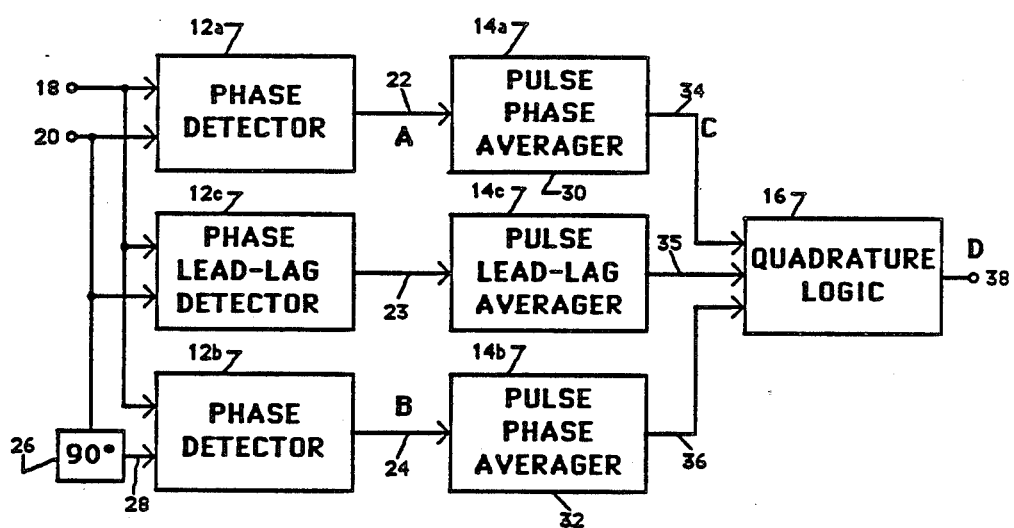
FIG. 1 is a block diagram illustrating the major sections of the phase measurement device according to the present invention.

FIG. 1 is a block diagram of a phase measuring device 10 illustrating major sections 12a, 12b, 12c, 14a, 14b, 14c, and 16 of the device. The sections 12a and 12b are average-phase detectors which, in response to an input signal 18 and a reference signal 20 generate average-phase voltage pulse trains 22 and 24 at points A and B, respectively. That is, the pulse train 22 is a train of voltage pulses proportional to the sampled phase. The input signal 18 is a pulsed single-frequency (continuous wave) signal in a background of noise. The pulse train 22 is proportional to the average-phase of the signal 18 relative to the reference signal 20 over a number of continuous wave cycles. The reference signal 20 is shifted ninety degrees in phase by a phase shifter 26, resulting in a quadrature signal 28. The average quadrature phase pulse train 24 is proportional to the average-phase of the quadrature signal 28 relative to the input signal 18 over a number of continuous wave cycles.

The section 12c is a phase lead-lag detector which in response to the input signal 18 and the reference signal 20 generates an average lead-lag indication or value 23, indicating if the input signal leads the reference signal on the average.

The sections 14a and 14b comprise pulse phase averagers 30 and 32, respectively, which average the phase variation of the average-phase voltage pulse trains 22 and 24 over a sequence of pulses to generate an average pulsed phase voltage 34 and an average pulsed quadrature phase voltage 36. The section 14c is a pulse lead-lag averager which is electrically coupled to the detector section 12c, is responsive to the average lead-lag signal 23, and generates an average pulsed lead-lag indication signal 35.

The section 16 is a quadrature logic section responsive to the phase voltages 34 and 36, and to the average pulsed lead-lag signal 35, and compensates for noise in the input signal 18, to generate a phase voltage 38 which is proportional to an accurate measurement of the phase of the input signal 18. In other words, the section 16 is a selector means for generating an output signal comprising selected first and second average values, wherein the first average value corresponds to a first time interval in real time of the selected signal when the first average phase varies linearly, and the second average value corresponds to a second interval in real time of the second average value adjacent the first time interval, when the first average phase varies nonlinearly.

Figure 2:
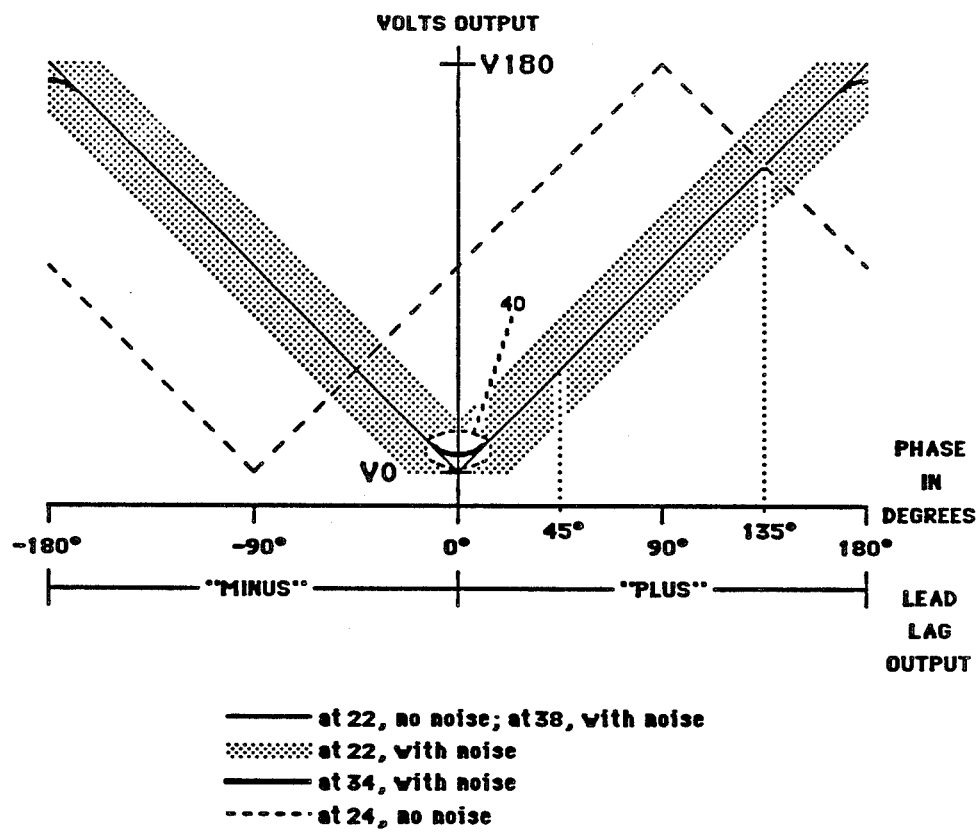
FIG. 2 is a chart illustrating the voltage and phase measured at the outputs of the various sections of the device as shown in FIG. 1.

Referring now to FIG. 2, as illustrated by the chart, the average-phase voltage pulse train 24, measured at point B of FIG. 1, of the quadrature signal 28, lags by ninety degrees the average-phase voltage pulse train 22, measured at point A of FIG. 1, of the input signal 18. As shown by the chart, the average-phase voltage pulse train 22 of the input signal 18, when measured against a noisy background, can be anywhere within the dotted region on the chart. The average pulsed-phase voltage 34, measured at point C of FIG. 1, against a noisy background, tracks the average-phase voltage pulse train 22, measured at point A, with the exception that at phase angles of −180°, 0°, and 180°, the average pulsed-phase voltage 34 exhibits a curved non-linearity 40 as shown in FIG. 2. However, the quadrature logic section 16 of the device according to the present invention generates the phase voltage 38 at point D of FIG. 1 which, as shown in FIG. 2, is substantially the same as the average-phase voltage pulse train 22 measured at point A.

Figure 3:
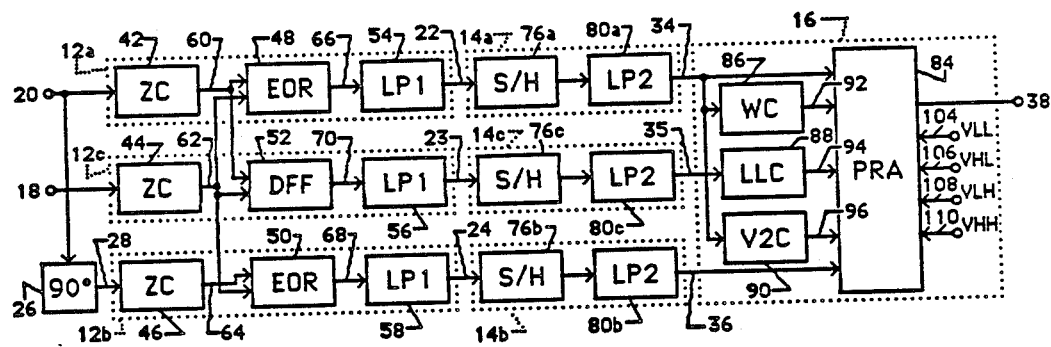
FIG. 3 is a block diagram illustrating in greater detail the major sections as shown in FIG. 1.

Referring now to FIG. 3, a more detailed block diagram of the device of FIG. 1 is illustrated. The average-phase detector section 12a has a zero-crossing detector 42, an exclusive-OR circuit 48, and an analog averager or integrator 54. The average-phase detector section 12b has a zero-crossing detector 46, an exclusive-OR circuit 50, and an analog averager or integrator 58. The phase lead-lag detector section 12c has a zero-crossing detector 44, a data flip-flop 52, and an analog averager or integrator 56.

The zero-crossing detector 42 is responsive to the reference signal 20, and generates a square wave 60 having the same phase as the reference signal 20. The zero-crossing detector 44 is responsive to the input signal 18 and generates a square wave 62 having the same phase as the phase of the input signal 18. The zero-crossing detector 46 is electrically coupled to the phase shifter 26, is responsive to the quadrature signal 28, and generates a square wave 64 having the same phase as the phase of the quadrature signal 28.

The exclusive-or circuit 48 is electrically coupled to the zero-crossing detector 42 and the zero-crossing detector 44. The exclusive-or circuit 48 is responsive to the square waves 60 and 62, and generates a pulse train 66 having pulse widths proportional to the absolute value of the phase difference between square waves 60 and 62. The exclusive-or circuit 50 is electrically coupled to the zero-crossing detectors 44 and 46, is responsive to square waves 62 and 64, and generates a pulse train 68 having pulse widths proportional to the absolute value of the phase difference between the square waves 62 and 64.

The data flip-flop 52 is electrically connected to the zero-crossing detectors 42 and 44, is responsive to the square waves 60 and 62, and generates an indication 70 as to whether the phase of the input signal 18 is leading or lagging the phase of the reference signal 20. The integrator 54 is electrically coupled to the exclusive-or circuit 48, is responsive to the pulse train 66, and generates the average-phase pulse train 22. The integrator 58 is electrically coupled to the exclusive-or circuit 50, is responsive to the pulse train 68, and generates the average-phase pulse train 24. The integrator 56 is electrically coupled to the data flip-flop 52 and generates the average lead-lag value 23.

The pulse phase averager sections 14a and 14b have sample-holds 76a and 76b, and integrators 80a and 80b, respectively. The sample-holds 76a and 76b are electrically coupled to the integrators 54 and 58, respectively, and are responsive to the average pulse trains 22 and 24, respectively. The sample-holds 76a and 76b sample the phase voltage of an individual pulse during the time period of the pulse and hold that value of the phase voltage until the occurrence of the next pulse in the pulse trains 22 and 24. The integrators 80a and 80b are electrically coupled to the sample-holds 76a and 76b, and in response to the output of the sample-holds 76a and 76b average any pulse-to-pulse difference of the measured phase in the pulse trains 22 and 24, and generate as outputs the average pulsed phase voltage 34 and the averaged pulsed quadrature phase voltage 36.

The pulse lead-lag averager section 14c has a sample-hold 76c and an integrator 80c. The sample-hold 76c is electrically coupled to the integrator 56, is responsive to the average lead-lag indication 23, and similarly to the other sample-holds, samples the phase voltage of an individual pulse during the time period of the pulse and holds that value of the pulse voltage until the occurrence of the next pulse in the pulse train 23. The integrator 80c is electrically coupled to the sample-hold 76c, and in response to the output of the sample-hold 76c, averages any pulse-to-pulse difference of the measured phase in the pulse train 23, and generates as an output the averaged pulse lead-lag indication signal 35.

The quadrature logic section 16 has an analog programmable amplifier 84, a analog window comparator 86, a analog lead-lag comparator 88, and a analog V2 comparator 90. The comparators 86 and 90 are electrically coupled to the integrator 80a. The comparator 88 is electrically coupled to the integrator 80c. The analog window comparator 86 generates an output voltage 92 which is low whenever the average pulsed phase voltage 34 is within the voltage range V2− to V2+ at points 98 and 100 (see FIG. 5c) of the quadrature logic section 16. The voltages V2− and V2+ correspond to the range of phases 135° to 45°. For any other voltages, thus representing phases outside of the range 135° to 45°, the output 92 is high. The lead-lag comparator 88 is responsive to the averaged pulsed lead-lag indication signal 35 and generates an output 94 which is low for a leading phase and high for a lagging phase. The V2 comparator 90 generates an output 96 which is high whenever the average pulsed phase voltage 34 is less than a voltage V2 at point 102 (see FIG. 5c), corresponding to a phase of less than 90°.

Figure 4:
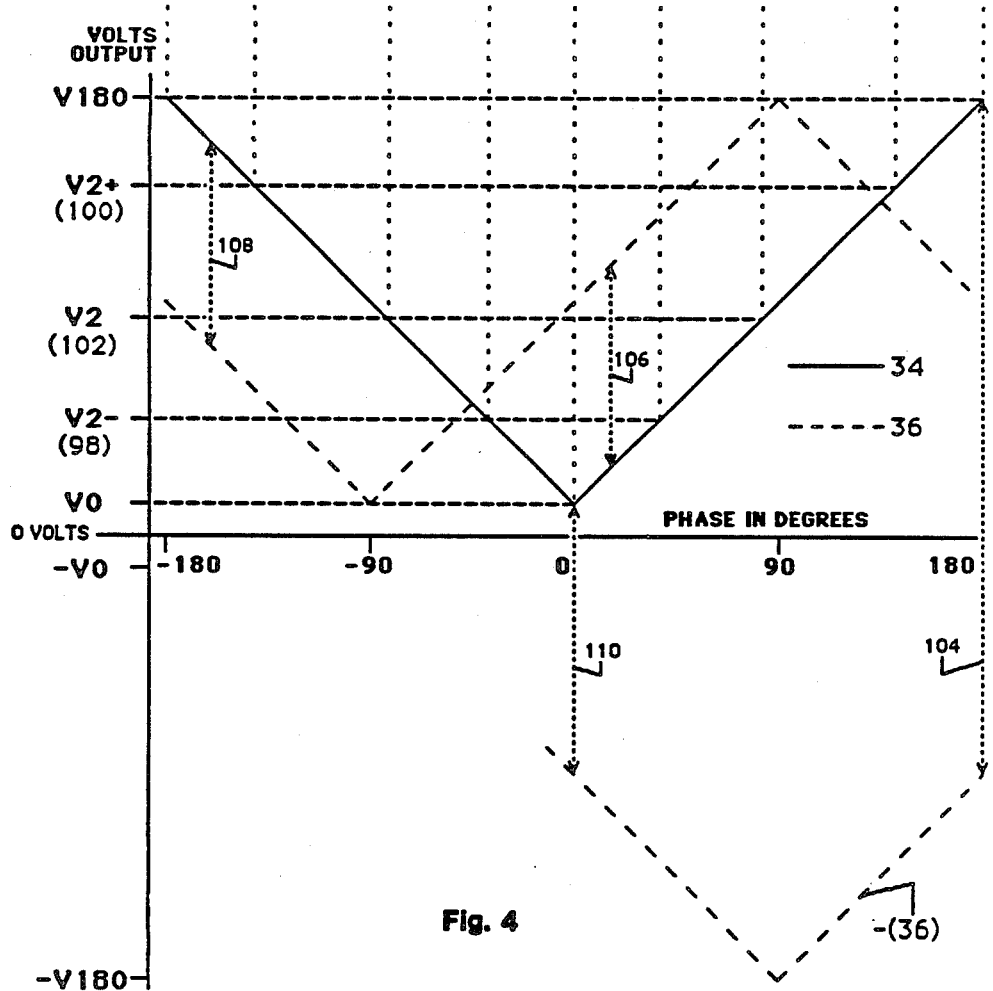
FIG. 4 is a chart illustrating the output generated at various parts of the device according to the present invention.

Referring now to FIGS. 3 and 4, the analog programmable amplifier 84 is electrically coupled to the analog comparators 86, 88, and 90, and to the integrators 80a and 80b. The analog amplifier 84 also has four reference signals input to it: VLL, VHL, VLH, and VHH, which are generated at points 104, 106, 108, and 110, respectively (see FIG. 5c) by precision voltage sources 112, 114, 116, and 118, respectively, within the quadrature logic section 16.

The phase voltage 38 is generated by the analog programmable amplifier 84 as follows. When the output 94 is high, the output 96 is low, and the output 92 is high, the phase voltage 38 is the sum of the average pulsed quadrature phase voltage 36 and VLH. When the comparator output 94 is high and the comparator output 92 is low, the phase voltage 38 is equal to the phase voltage 34. When the outputs of all three comparators 92, 94, and 96 are high, the phase voltage 38 is equal to the difference of the voltage VHH minus the quadrature phase voltage 36. When the output 94 is low, the output 96 is high, and the output 92 is high, the phase voltage 38 is equal to the difference of the quadrature phase voltage 36 minus the voltage VHL. When both the outputs 92 and 94 are low, the phase voltage 38 is equal to the phase voltage 34. When the output 94 is low, the output 96 is low, and the output 92 is high, the phase voltage 38 is equal to the difference of the voltage VLL minus the quadrature phase voltage 36.

Figure 5:
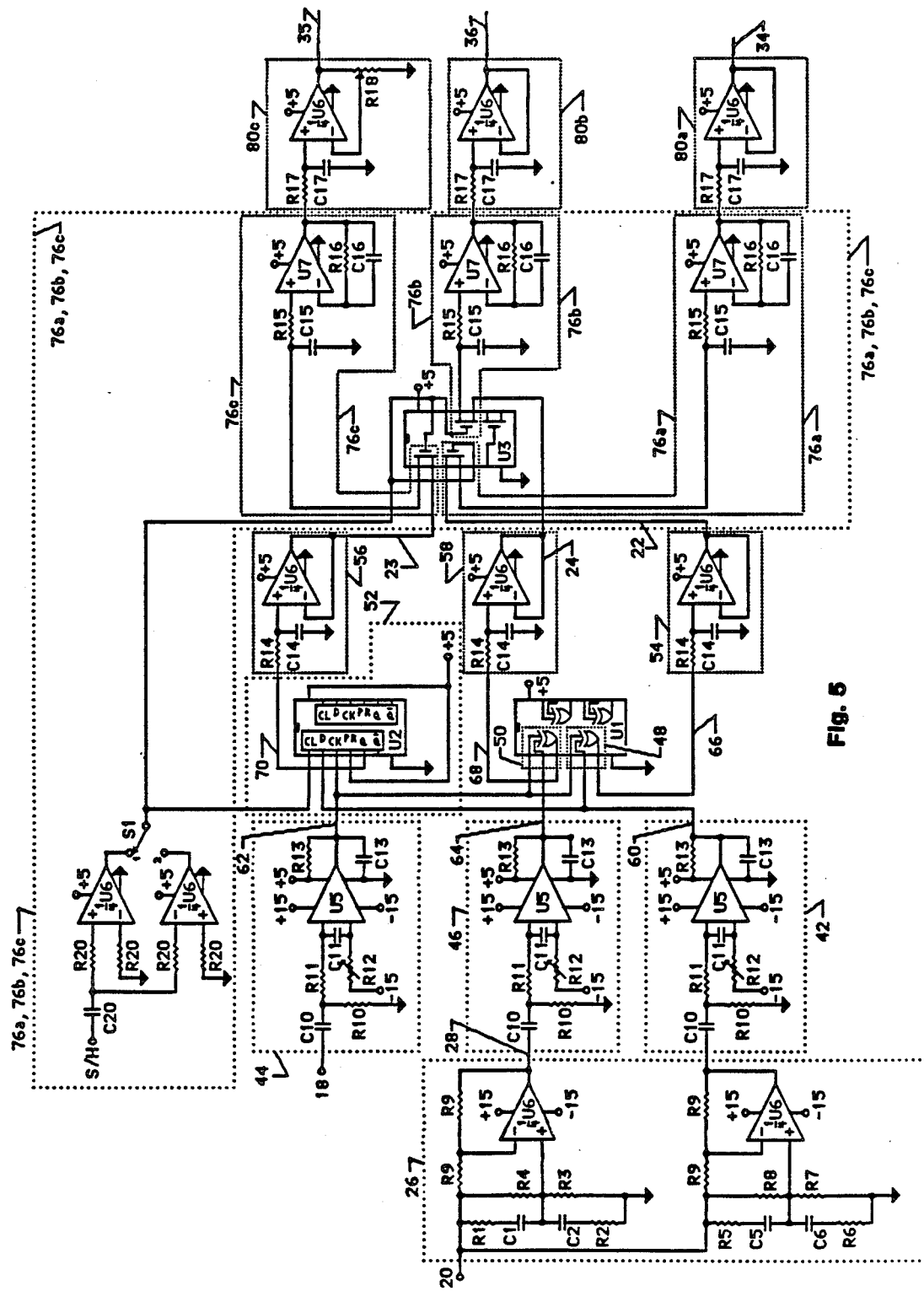
FIG. 5 is a schematic diagram of a phase and device built in accordance with the present invention.

Referring now to FIG. 5 and Table 1, a schematic diagram of the device of FIGS. 1 and 3 is illustrated in FIG. 5, and the values and/or part numbers of the components are listed in Table 1. The sections 12, 14, and 16 of FIG. 1 are shown in the heavy dashed lines, and the parts of those sections shown in FIG. 3 are shown in the lighter dashed lines.

The principles, preferred embodiments, and modes of operation of the present invention have been described in the foregoing specification. The invention is not to be construed as limited to the particular forms disclosed, since these are regarded as illustrative rather than restrictive. Moreover, variations and changes may be made by those skilled in the art without departing from the spirit of the invention. For example, all three sections 12, 14, and 16, could use analog circuitry. Also, the quadrature logic section 16 could be replaced with a true algebraic averaging circuit.

TABLE 1

| PARTS SUMMARY FOR FIG. 5 | | |
| --- | --- | --- |
| U1 | SN74S86N | TTL quad exclusive-OR |
| U2 | SN74S74N | TTL dual data flip-flop |
| U3 | CD4066A | Quad CMOS analog switch |
| U4 | HA2405-5 | Quad programmable operational amplifier |
| U5 | LM361N | TTL output high speed comparator |
| U6 | HA4741 | Quad operational amplifier |
| U7 | LF157A | JFET operational amplifier |
| D1 | 1N4732A | 4.7 V zener |
| D2 | | LED |
| C1,C5 | | 200 pF |
| C2,C6,C11,C14 | | 1000 pF |
| C10 | | 1 µF |
| C13 | | 1 pF |
| C15 | | 0.1 µF polycarbonate |
| C16 | | 10 pF |
| C17,C20 | | 0.1 µF |
| C30 | | 15 pF |
| R1 | | 430Ω |
| R2,R10,R13 | | 1 kΩ |
| R3 | | 9.77 kΩ |
| R4 | | 4.2 kΩ |
| R5 | | 2.17 kΩ |
| R6 | | 5.05 kΩ |
| R7 | | 49.16 kΩ |
| R8 | | 21.13 kΩ |
| R9,R20 | | 10 kΩ |
| R11,R19 | | 100Ω |
| R12 | | 1 MΩ potentiometer |
| R14 | | 15.8 kΩ |
| R15 | | 100 kΩ |
| R16 | | 5 kΩ |
| R17 | | 1 MΩ |
| R18 | | 500 kΩ potentiometer |
| R21,R39 | | 10Ω |
| R22+R23+ R24,R25+R26, R27+R28,R29, R30+R31, R32+R33, R34+R35, R36+R37 | | 1.25 kΩ |
| R38 | | 10 kΩ potentiometer |
| R40 | | 20 kΩ |

What is claimed is:

1. A phase measurement device for measuring the phase of a pulsed single-frequency sinusoidal input signal, the device comprising:

a first zero-crossing detector means responsive to the input signal for generating a first square wave having the same phase as the phase of the input signal;

a second zero-crossing detector means responsive to a reference signal for generating a second square wave having the same phase as the phase of the reference signal;

shifting means responsive to the reference signal for generating a quadrature signal wherein the phase of the quadrature signal is shifted 90° from the phase of the reference signal;

a third zero-crossing detector means responsive to the quadrature signal for generating a third square wave having the same phase as the phase of the quadrature signal;

a first exclusive-or means electrically coupled to the first and second zero-crossing detector means and responsive to the first and second square waves for generating a first pulse train having pulse widths proportional to the absolute value of the phase difference between the first and second square waves;

a second exclusive-or means electrically coupled to the second and third zero-crossing detector means and responsive to the second square wave and the third square wave for generating a second pulse train having pulse widths proportional to the absolute value of the phase difference between the second and third square waves;

sign means electrically coupled to the first and second zero-crossing detector means and responsive to the first and second square waves for generating the sign of the phase of the input signal;

a first analog averager means electrically coupled to the first exclusive-or means and responsive to the first pulse train for generating a first average pulse train proportional to the phase difference between the input signal and the reference signal;

a second analog averager means electrically coupled to the second exclusive-or means and responsive to the second pulse train for generating a second average pulse train proportional to the phase difference between the input signal and the quadrature signal;

a first analog pulse integrator means electrically coupled to the first averager means and responsive to the first average pulse train for generating a first average;

a second analog pulse integrator means electrically coupled to the second averager means and responsive to the second average pulse train for generating a second average;

an analog quadrature logic means responsive to the first and second average for generating a voltage proportional to the phase of the input signal.

2. Apparatus for generating a signal indicative of the phase of a selected pulsed CW signal, in a background of noise, relative to the phase of a reference pulsed CW signal, which comprises:

a first averaging phase detector having a range of 360° and possessing a single valued linear transfer function responsive to the selected signal and to the reference signal to yield a first average phase of the selected signal relative to the reference signal;

a second averaging phase detector having a range of 360° and possessing a single-valued linear transfer function responsive to the selected signal and to the reference signal shifted 90° to yield a second average phase of the selected signal relative to the shifted signal;

a first pulse phase averager responsive to the first average phase signal to produce a first average value with time of the phase variations in the first average phase signal;

a second pulse phase averager responsive to the second average phase signal to produce a second average value with time of the phase variations in the second average phase signal;

selector means for generating an output signal comprising first and second selected average values, wherein the first selected average value corresponds to a first time interval in real time of the first average value when the first average phase varies linearly, and the second selected average value corresponds to a second time interval in real time of the second average value adjacent the first time interval, when the first average phase varies non-linearly.

* * * * *

UNITED STATES PATENT AND TRADEMARK OFFICE
CERTIFICATE OF CORRECTION

PATENT NO. : 4,712,060

DATED : December 8, 1987

INVENTOR(S) : Rick S. Bailey et al.

It is certified that error appears in the above-identified patent and that said Letters Patent are hereby corrected as shown below:

Column 1, line 40, change "U.S. Patent No. 3,646,34" to --U.S. Patent No. 3,646,334--.

Signed and Sealed this

Twelfth Day of April, 1988

Attest:

DONALD J. QUIGG

Attesting Officer

Commissioner of Patents and Trademarks